United States Patent

Le Campion

[11] Patent Number: 6,140,847
[45] Date of Patent: Oct. 31, 2000

[54] CIRCUIT FOR GENERATING PULSES OF HIGH VOLTAGE CURRENT DELIVERED INTO A LOAD CIRCUIT AND IMPLEMENTING METHOD

[75] Inventor: Christophe Le Campion, Mereville, France

[73] Assignee: Commissariat a l'Energie Atomique, France

[21] Appl. No.: 09/242,057

[22] PCT Filed: Aug. 7, 1997

[86] PCT No.: PCT/FR97/01466

§ 371 Date: Feb. 8, 1999

§ 102(e) Date: Feb. 8, 1999

[87] PCT Pub. No.: WO98/07235

PCT Pub. Date: Feb. 19, 1998

[30] Foreign Application Priority Data

Aug. 8, 1996 [FR] France .................................. 96 10006

[51] Int. Cl.[7] .................................................. H03B 1/00
[52] U.S. Cl. .......................................... 327/111; 108/103
[58] Field of Search ..................................... 327/111, 108, 327/181, 182, 183, 171, 172, 291, 295, 103

[56] References Cited

U.S. PATENT DOCUMENTS

| | | | |
|---|---|---|---|
| 3,910,679 | 10/1975 | Rushworth et al. | 350/150 |
| 4,629,993 | 12/1986 | Bouvier et al. | 328/67 |
| 4,754,226 | 6/1988 | Lusignan et al. | 328/158 |
| 5,072,191 | 12/1991 | Nakajima et al. | 328/65 |
| 5,396,165 | 3/1995 | Hwang et al. | 323/210 |
| 5,563,479 | 10/1996 | Suzuki | 318/139 |
| 5,880,690 | 3/1999 | Rothenberg | 341/161 |

*Primary Examiner*—Tuan T. Lam
*Assistant Examiner*—Hiep Nguyen
*Attorney, Agent, or Firm*—Hayes, Soloway, Hennessey, Grossman & Hage, P.C.

[57] ABSTRACT

The invention relates to a pulse generation circuit outputting pulses with very short rise and fall times. This circuit comprises two high voltage power supply circuits (1 and 2), each outputting a current into a single load circuit (7) consisting of a single or double Pockels cell, at two different times.

4 Claims, 2 Drawing Sheets

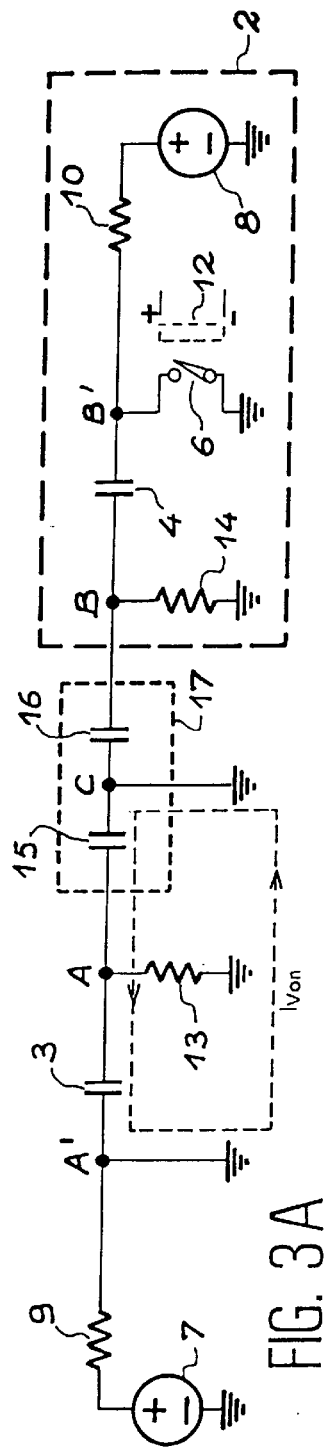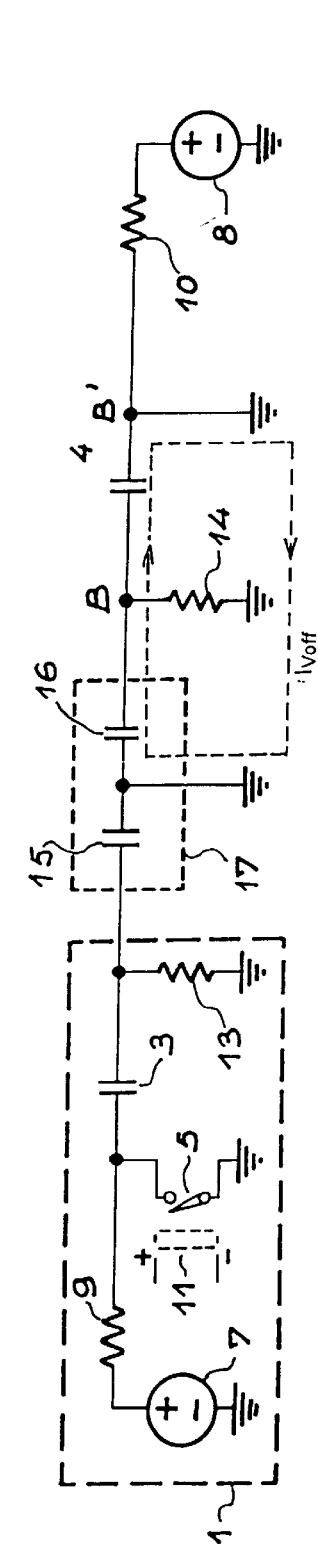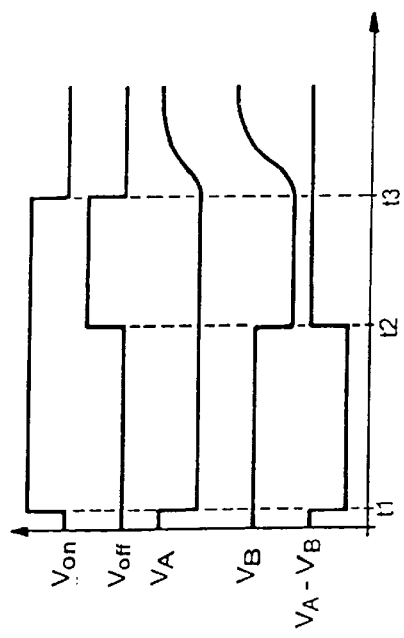

CIRCUIT FOR GENERATING PULSES OF HIGH VOLTAGE CURRENT DELIVERED INTO A LOAD CIRCUIT AND IMPLEMENTING METHOD

DESCRIPTION

1. Domain of invention

This invention relates to a circuit for generating current pulses at high voltage output into a load circuit, and particularly into a capacitive load circuit. It also relates to the process for controlling operation of this circuit.

Applications of the invention occur in techniques for the repeated transfer of pulses that may be as high as several kilovolts and with different durations, succeeding each other at variable and possibly very short intervals.

2. State of the art

In the field of repeated pulse transfers, pulses are generally produced by a current generator that is connected to the dissipation circuit or the load circuit through a switch that may be closed or opened at will. This switch may be a transistor. The single switch may be replaced by several switches in series, if necessary due to the voltage at the terminals of the dissipation circuit. A capacitor is added to store the necessary energy, and is connected between the dissipation circuit and the voltage generator. This capacitor charges when the switch is opened and discharges into the dissipation circuit when the switch is closed. This thus gives a sufficiently fast voltage rise in the dissipation circuit, but only if the previous pulse has terminated for a specific time.

It is frequently necessary to obtain suitable pulses, i.e. with very short rise and fall times, immediately after the end of a previous pulse.

DESCRIPTION OF THE INVENTION

The purpose of the invention is to overcome the disadvantages of the technique described above.

This is done by including a pulse generation circuit with two high voltage power supply circuits each outputting a current in the same load circuit at two different instants. This circuit can generate pulses with square rising and falling fronts and with a controllable duration.

More precisely, the invention relates to a circuit for generating current pulses at high voltage comprising a first power supply circuit outputting a first current into a load circuit and comprising a first capacitor, a first switch connected onto a terminal on the first capacitor and a first voltage generator also connected to this terminal on the first capacitor. This pulse generation circuit is characterized by the fact that it comprises a second power supply circuit outputting a second current in the load circuit and comprising a second capacitor, a second switch connected to a terminal on the second capacitor and a second voltage generator also connected to this terminal on the second capacitor.

According to one embodiment of the invention, the load circuit comprises two capacitive loads connected to the first power supply circuit and to the second power supply circuit respectively, and forming a double Pockels cell.

According to another embodiment of the invention, the load circuit comprises a capacitive load connected to the first power supply circuit through a first terminal, and to the second power supply circuit through a second terminal, so as to form a single Pockels cell.

The invention also relates to a process for controlling operation of this circuit for generating current pulses at high voltage, consisting of closing the second switch after closing the first switch, the time elapsed between closing the first and second switches being adjustable.

BRIEF DESCRIPTION OF THE FIGURES

FIGS. 3A and 3B show the circuit in FIG. 1 in operation when the first switch is closed, and when the second switch is closed, respectively;

FIG. 4 shows the time diagrams for the various circuit voltages in FIG. 1 when this circuit is in operation.

DESCRIPTION OF EMBODIMENTS OF THE INVENTION

Figure 1:
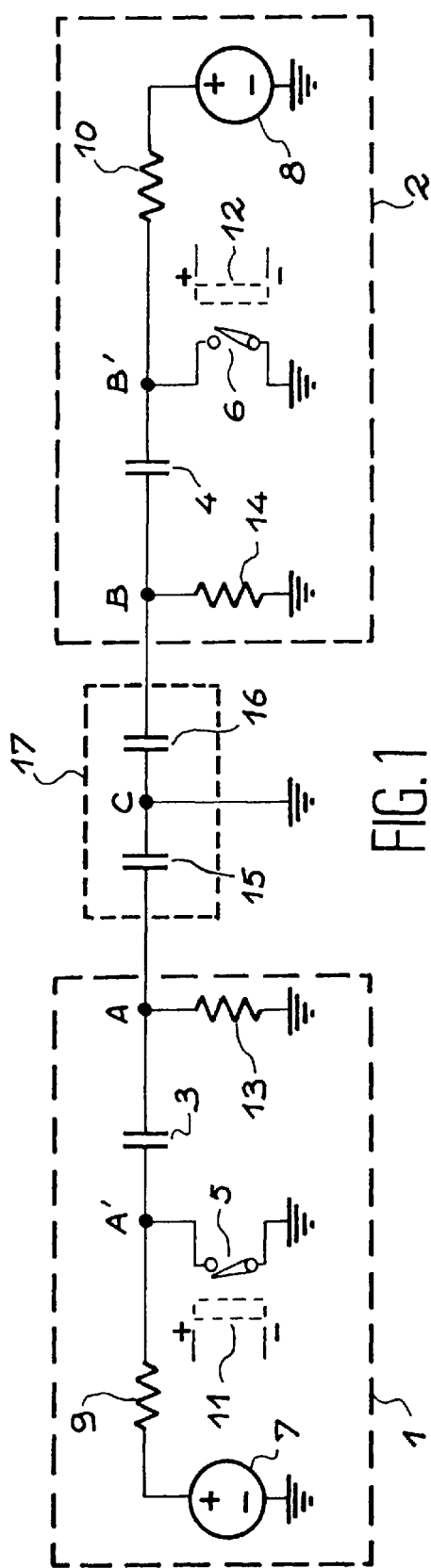
FIG. 1 shows a first embodiment of the pulse generation circuit according to the invention.

FIG. 1 shows the pulse generation circuit according to the first embodiment of the invention.

This circuit comprises a first high voltage power supply circuit with capacitive storage, reference 1, that outputs a current $I_{Von}$ in the load circuit 17.

This power supply circuit 1 is in the form of a branch connection between junctions A and the earth; this branch connection comprises a first capacitor 3 and a junction A' on which a first voltage generator 7, and a first switch 5 are connected, respectively. Furthermore, there is a resistor 9 between the junction A' and the first voltage generator 7, that limits the generator current.

The first switch 5 is activated from a control circuit 11. This control circuit 11 opens and closes switch 5 and consequently controls the current output by the power supply circuit 1 to the load circuit 17, as will be explained in more detail later.

A second branch connection between junction A and the earth includes a resistor 13 through which the generator capacitors are discharged.

Therefore the power supply circuit 1 is connected to junction A, to which the load circuit 17 is also connected.

There is a second high voltage power supply circuit with capacitive storage, reference 2, symmetric with the load circuit 17.

This second power supply circuit 2 is entirely symmetric in its composition to the power supply circuit 1. It is in the form of a branch connection between junction B and the earth; this branch connection comprises a second capacitor 4, and a junction B' on which a second voltage generator 8, preceded by a generator current limitation resistor 10, and a second switch 6 controlled by the control circuit 12, are connected.

A resistor 14 is connected as a branch connection between junction B and the mass, symmetric to resistor 13 connected to junction A. This resistor 14 performs the same role for power supply circuit 2, as resistor 13 for power supply circuit 1.

Thus, each power supply circuit 1 and 2 is symmetrically connected to a branch of the load circuit 17.

As we will see later, the second power supply circuit 2 outputs a current $I_{Voff}$ in the load circuit 17 a specific time after the power supply circuit 1 has output its current $I_{Von}$.

According to the embodiment shown in FIG. 1, the load circuit 17 consists of a double Pockels cell. This double Pockels cell comprises two capacitive loads 15 and 16 each connected to earth at a point C.

As will become clearer later, this pulse generation circuit equipped with two power supply circuits each connected to the same load circuit is capable of generating pulses with very short rise and fall times, which graphically results in square rising and falling fronts. Furthermore, with this type of circuit the width of pulses produced can be adjusted by modifying the time interval between switching of switch 5 and switching of switch 6.

Figure 2:
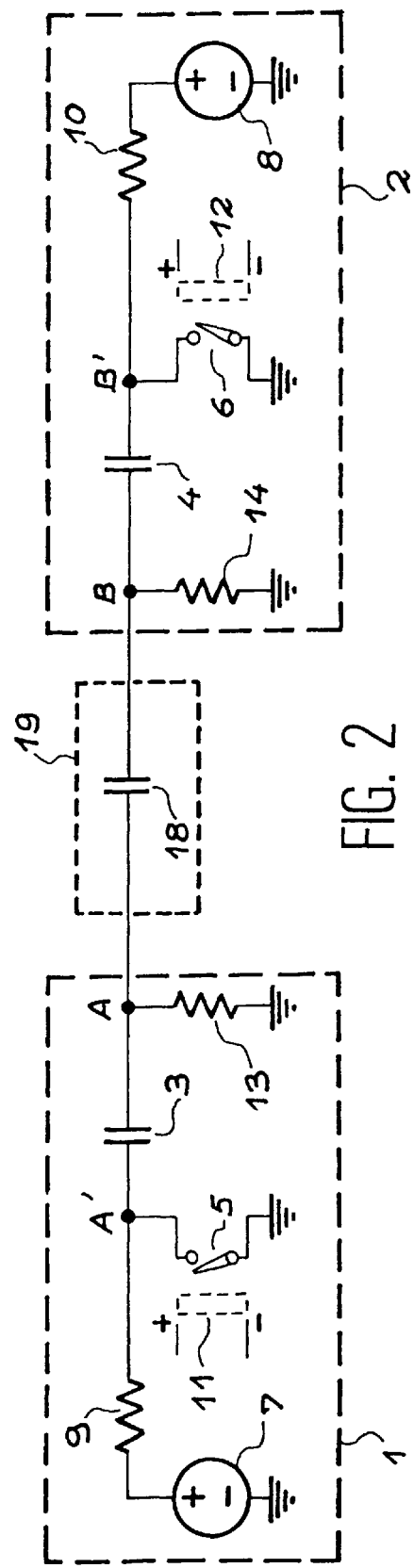
FIG. 2 shows a second embodiment of the pulse generation circuit according to the invention.

FIG. 2 shows a pulse generation circuit conform with a second embodiment of the invention.

As with the embodiment in FIG. 1, this circuit comprises a first and second power supply circuit 1 and 2 identical to those described above. Therefore they will not be described again.

These two power supply circuits 1 and 2 are both connected to a load circuit 19 that consists of a single Pockels cell. This cell comprises a single capacitive load 18.

This circuit in FIG. 2 operates in a similar way to that shown in FIG. 1. However, the pulse rise and fall times are not quite as fast as those for a circuit with a double Pockels cell, but they are sufficiently fast to obtain square pulses.

FIGS. 3A and 3B show the circuit in FIG. 1 during operation.

More precisely, FIG. 3A shows the state of the circuit when switch 5 is closed but switch 6 is opened.

Firstly, note that in the initial state capacitor 3 is charged since the voltage generator 7 charged it through the resistive elements 9 and 13 when switch 5 was opened (i.e. when the circuit was in the initial state shown in FIG. 1).

Then at the required moment, a control pulse $V_{on}$ is produced by the control circuit 11 to make switch 5 close which then releases the energy stored in the capacitor 3 on junction A. A voltage $V_A$ then appears at junction A for a very short time.

Thus when switch 5 is switched, the pulse generation circuit operates as shown in FIG. 3A. A current $I_{Von}$ circulates in loop 21 in the direction shown by the arrows in FIG. 3A.

During this time, the second voltage generator 8 produces a voltage that recharges the second capacitor 4 through resistive elements 10 and 14.

After a given time, which lags behind the time at which the pulse $V_{on}$ was controlled, a control pulse $V_{off}$ is output by the control circuit 12 to put switch 6 into the closed position, which releases the energy stored in the capacitor 4 on junction B. A voltage $V_B$ then appears on junction B for a very short time.

When switch 6 is closed, the pulse generation circuit operates as shown in FIG. 3B. A current $I_{Voff}$ circulates in loop 20 in the direction shown by the arrows in FIG. 3B.

FIG. 4 shows the time diagram for the voltages in the pulse generation circuit in FIGS. 1, 3A and 3B.

More precisely, channel A in FIG. 4 shows the pulse $V_{on}$ output by the control circuit 11 to temporarily close switch 5. As shown by channel A, the switch closes at time t1 and opens at time t3. During the time interval t3–t1, the current $I_{von}$ stored in capacitor 3 is released to the Pockels cell 17.

This voltage $V_{on}$, and voltages $V_{off}$, $V_A$ and $V_B$, is of the order of 20 Volts.

Channel B shows the $V_{off}$ pulse output at time t2 by the control circuit 12 to temporarily close switch 6. Switch 6 opens at time t3. Thus during the interval t3–t2, the current $I_{Voff}$ stored in current capacitor 4 is released to the Pockels cell 17.

Channel C in FIG. 4 shows the voltage $V_A$ measured at junction A starting from time t1. This voltage $V_A$ is negative. It appears very quickly at time t1 and consequently has a square falling front, whereas the rising front starting from time t3 is much slower.

Channel D in FIG. 4 shows the voltage $V_B$ measured at junction B starting at time t2. This voltage $V_B$ is negative and appears very quickly at time t2. Therefore it has a square falling front, whereas the rising front starting from time t3 is much slower.

Channel E in FIG. 4 shows the $V_A-V_B$ pulse obtained from the voltages $V_A$ and $V_B$. As can be seen in this Figure, the $V_A-V_B$ pulse has a square rising front and a square falling front, which means that it has very short rise and fall times.

Furthermore, the time interval t1–t2 may be modified to suit needs, by offsetting t2 with respect to t1, i.e. by offsetting the time at which the control circuit 12 outputs the pulse that will change the position of switch 6.

Therefore, this circuit can very quickly output high voltage values at a relatively low cost, since this circuit is composed of two identical generation circuits.

What is claimed is:

1. Circuit for generating current pulses at high voltage comprising a first power supply circuit (1) outputting a first current ($I_{Von}$) into a load circuit (17 or 19) the first power supply circuit comprises a first capacitor, a first switch connected to a junction A' of the first capacitor and a first voltage generator also connected through this junction A' to the first capacitor, and secondly a second power supply circuit, characterized in that this second power supply circuit outputs a second current ($I_{Voff}$) into the load circuit and comprises a second capacitor (4), a second switch connected to a junction B' of the second capacitor and a second voltage generator also connected through this junction B' to the second capacitor.

2. Pulse generation circuit according to claim 1, characterized in that the load circuit (17) comprises two capacitive loads connected is series, coupled to the first power supply circuit and the second power supply circuit respectively, and forming a double Pockels cell.

3. A pulse generation circuit according to claim 1, characterized in that the load circuit comprises one capacitive load connected to the first power supply circuit through a junction A, and to the second power supply circuit through a junction B, in order to form a single Pockels cell.

4. A circuit for generating current pulses at high voltage for use in a pulse generation circuit in accordance with claim 1, characterized in that the second switch is closed after closing the first switch, the time (t2–t1) that elapses between when the first switch closes and the second switch closes closing being adjustable.

* * * * *

UNITED STATES PATENT AND TRADEMARK OFFICE
CERTIFICATE OF CORRECTION

| | |
|---|---|
| PATENT NO. | : 6,140,847 |
| DATED | : October 31, 2000 |
| INVENTOR(S) | : Christophe Le Campion |

It is certified that error appears in the above-identified patent and that said Letters Patent is hereby corrected as shown below:

Column 4,
Lines 38-39, delete "and secondly a second power supply circuit,".
Line 39, change "this" to -- it comprises a --.
Line 40, change "outputs" to -- outputting --.
Line 41, change "comprises" to -- comprising --.

Signed and Sealed this

Eleventh Day of June, 2002

Attest:

JAMES E. ROGAN
*Attesting Officer*  *Director of the United States Patent and Trademark Office*